(12) United States Patent
Becker et al.

(10) Patent No.: US 9,998,035 B2
(45) Date of Patent: Jun. 12, 2018

(54) RESONANT ENERGY HARVESTER, AIRCRAFT COMPONENT COMPRISING THE RESONANT ENERGY HARVESTER AND AN AIRCRAFT COMPRISING THE RESONANT ENERGY HARVESTER OR THE AIRCRAFT COMPONENT

(71) Applicant: Airbus Defence and Space GmbH, Ottobrun (DE)

(72) Inventors: Thomas Becker, Osterholz-Scharmbeck (DE); Alexandros Elefsiniotis, München (DE); Ulrich Schmid, Vienna (AT)

(73) Assignee: AIRBUS DEFENCE AND SPACE GMBH, Ottobrunn (DE)

( * ) Notice: Subject to any disclaimer, the term of this patent is extended or adjusted under 35 U.S.C. 154(b) by 578 days.

(21) Appl. No.: 14/574,766

(22) Filed: Dec. 18, 2014

(65) Prior Publication Data
US 2015/0180376 A1 Jun. 25, 2015

(30) Foreign Application Priority Data

Dec. 20, 2013 (EP) .................................... 13199094

(51) Int. Cl.
*H02N 2/18* (2006.01)
*H02N 1/00* (2006.01)
*H02N 3/00* (2006.01)
*H01L 41/113* (2006.01)

(52) U.S. Cl.
CPC ............. *H02N 2/186* (2013.01); *H02N 1/006* (2013.01); *H02N 2/185* (2013.01); *H02N 3/00* (2013.01); *H01L 41/1136* (2013.01)

(58) Field of Classification Search
CPC ... H01L 41/1136; H01L 41/04; H01L 41/187; H02N 2/185; H02N 1/006; H02N 3/00; H02N 2/18; H02N 1/00; H02N 2/00; H02K 7/18; F03G 7/08
USPC ............... 310/339, 319, 336, 311, 328, 800; 290/1 R; 252/62.9 PZ, 62.9 R; 367/163, 367/164
IPC ................. H02N 2/18,1/00, 2/00; H01L 41/04, 41/187; H02K 7/18; F03G 7/08
See application file for complete search history.

(56) References Cited

U.S. PATENT DOCUMENTS 7,592,783 B1 * 9/2009 Jarvinen .................. H02N 1/04
290/1 A
2005/0034464 A1 2/2005 Gonzalez

OTHER PUBLICATIONS

The European Search Report for the corresponding European patent application No. 13199094.7, dated Mar. 18, 2014.

* cited by examiner

*Primary Examiner* — Thomas Dougherty
*Assistant Examiner* — Karen B Addison
(74) *Attorney, Agent, or Firm* — Global IP Counselors, LLP

(57) ABSTRACT

An energy harvester for an aircraft comprises a first portion, a movable element and a kinetic-to-electric-energy-converter. The first portion includes a charge collecting device having an electrical permittivity different to that of air. The charge collecting device is configured to be exposed to an air flow. The movable element is configured to be driven by the charge of the charge collecting device, and the kinetic-to-electric-energy-converter is configured to generate energy by the movement of the movable element.

19 Claims, 2 Drawing Sheets

RESONANT ENERGY HARVESTER, AIRCRAFT COMPONENT COMPRISING THE RESONANT ENERGY HARVESTER AND AN AIRCRAFT COMPRISING THE RESONANT ENERGY HARVESTER OR THE AIRCRAFT COMPONENT

CROSS-REFERENCE TO RELATED APPLICATION

This application claims priority under 35 U.S.C. § 119(a) to European Patent Application No. 13 199 094.7, filed on Dec. 20, 2013, the entire contents of European Patent Application No. 13 199 094.7 are hereby incorporated herein by reference.

BACKGROUND

Field of the Invention

The invention relates to an energy harvester. Furthermore, the invention relates to an aircraft component comprising the energy harvester. The invention also relates to an aircraft comprising the energy harvester and/or the aircraft component as described before.

Background Information

Static electricity is a well-known effect of materials being in contact at first and then got released from each other. This effect can be enhanced by friction, called triboelectricity. A short description is given in Dominic Samson, Energy harvesting in aircraft with special focus on thermal electrics, Dissertation, TU Vienna, 2011: "If two bodies with different permittivities are put in contact, the one having the higher permittivity will be charged positively and the other will be charged negatively after they are separated. The corresponding current is called triboelectric current. If both materials are uncharged perfect conductors, the charge exchange during the contact is counterbalanced by an opposite charge exchange during separation. After the separation both materials are still neutral except if the separation process is very fast compared to the charged transfer. In the case of dielectric materials such as painted aircraft surfaces, the drift velocity of the charges is low in comparison to the separation speed and there is a residual charge."

An aircraft typically collects charges during cruising by air friction; these charges (which can be harmful for electric devices or communication systems) are being released by so-called static dischargers.

SUMMARY

An objective of the invention is to provide an improved device for harvesting energy.

An energy harvester, in particular for an aircraft, comprises a first portion, a movable element and a kinetic-to-electric-energy-converter. The first portion includes a charge collecting device having an electrical permittivity different to the one of air. The charge collecting device is configured to be exposed to an air flow. The movable element is configured to be driven by the charge of the charge collecting device. The kinetic-to-electric-energy-converter is configured to generate energy by the movement of the movable element.

Preferably, the charge collecting device is an element of the first portion that is exposed to an air flow. The charge collecting device may be constituted by different shapes. The permittivity of the charge collecting device differs from the one of air such that triboelectric charge is generated at the charge collecting device due to the air flowing by the charge collecting device. The air flow may be caused by the movement of the charge collecting device, for example when the charge collecting device is part of an aircraft or other vehicles. In case of an aircraft, the air flow has a high velocity with respect to the charge collecting device. This may lead to the generation of high voltages at charge collecting device.

The movable element preferably has at least one part that can be moved whereby a movement can be an elastical deformation, a translation, a compression, or an expansion of the respective part. In particular, the movable element is driven by a change in the charge density of the charge collecting device. Preferably, the electric field of the charge of the first portion drives the movable element. To this end, the charge generated at the charge collecting device may be transferred within the first portion in order to drive the movable element. For example, the movable element is micro-engineered.

The kinetic-to-electric-energy-converter preferably has at least one element that transfers the movement of the movable element into energy, in particular electrical energy. For example, the kinetic-to-electric-energy-converter is a micro-engineered device such as a dynamo. Preferably, the kinetic-to-electric-energy-converter is mechanically linked to the movable element. For example, the kinetic-to-electric-energy-converter comprises a magnet and a coil wherein the relative movement of the magnet with respect to the coil generates voltage in the coil.

The energy harvester preferably does not directly store the energy generated at the charge collecting device, but uses the movable element and the kinetic-to-electric-energy-converter to generate energy. The charge generated at the charge collecting device has often a high voltage which needs to be transformed down in order to power an electrical device. Hence, the energy harvester may provide the advantageous effect that the voltage of the electrical energy generated by the kinetic-to-electric-energy-converter is in a range that can be used to power an electrical device.

The electrical energy generated by the kinetic-to-electric-energy-converter may be directly supplied to the electric device or can be stored by an energy storing unit such as a capacitor or an accumulator. The energy storing unit may be connected to the electrical device. The electrical device may be a sensor node or a sensor array for measuring various parameters in the aircraft or vehicle. For manufacturing the first portion and/or the elastic element and/or the kinetic-to-electric-energy-converter, MEMS technology such as deposition of layers, photolithography, and etching steps may be employed.

In a disclosed embodiment, the movable element comprises an elastic element having a first end and a second end, the elastic element comprising a conductive material, and a second portion configured to be exposed to an air flow, the second portion comprising a conductive material and being electrically connected to the first end, wherein, preferably, the kinetic-to-electric-energy-converter is fixed to the elastic element, wherein, further preferably, the second end is arranged to move freely and is arranged in the vicinity of the first portion and wherein, preferably, the first end is fixed.

The elastic element may be made of a material that can be elastically deformed. The elastical deformation is preferably caused by an attractive or repulsive force between the conductive material of the elastic element and the charge of the first portion. The conductive material can be a layer or a block of the elastic element. Alternatively, the elastic element is made of a conductive material. In particular, the second end, the free end, is arranged in the vicinity of the first portion, preferably such that the second end is moved by the charge of the first portion. The first end of the elastic element is fixed, for example to the second portion.

The second portion is configured to be exposed to an air flow and, for example, arranged in the vicinity of the charge collecting device. The second portion comprises, for example, a layer of a conductive material, partially or wholly covering the second portion. Alternatively, the second portion is completely or partially made of a conductive material. Preferably, the conductive material of the second portion is electrically connected to the first end, preferably to the conductive material of the elastic material.

The function of the disclosed energy harvester may be as follows: the charge collecting device is charged by triboelectric friction between the charge collecting device and the flow of air. Because of this, the first portion generates an electric field. Preferably, the elastic element and in particular the first end of the elastic element, is arranged in the electric field of the first portion. Due to the interaction of the conductive material with the electric field, the elastic element is elastically deformed, for example, by a change in the electric field due to a change in the charge at the charge collecting device.

In a disclosed embodiment, the elastic element is arranged in the vicinity of the first portion such that the elastic element (in particular the conductive material) contacts the first portion when the electric field reaches a certain threshold. When contact between the conductive material of the elastic element and the first portion is made, a current flows from a charge collecting device to the second portion, where the charge can be transmitted to the air flow. Consequently, the charge in the first portion is reduced and, therefore, the electrical field changes. Due to this, the elastic element is elastically moved, for example, in its original position.

The elastic deformation of the elastic element may be used by the kinetic-to-electric-energy-converter to generate electrical energy. This can be achieved such that the deformation of the elastic element induces an elastic deformation of the kinetic-to-electric-energy-converter which in term causes the generation of a voltage. This voltage may be used to power the electric device.

In a disclosed embodiment, the first portion comprises a first conductive section electrically connected to the charge collecting device and arranged in the vicinity of the second end. The first conductive section may be a metallic plate or layer that is arranged in the vicinity of the first end of the elastic element and electrically connected to the charge collecting device. In this case, the charge generated at the charge collecting device is supplied to the first conductive section where an electric field is generated that interacts with the conductive material of the elastic element. In this way, the efficiency of the energy harvester can be improved.

In a disclosed embodiment, the kinetic-to-electric-energy-converter comprises a piezoelectric material, in particular a piezoelectric ceramic. When the kinetic-to-electric-energy-converter is fixed to the elastic element, the deformation of the elastic element may induce a voltage in the piezoelectric material. Preferably, the kinetic-to-electric-energy-converter is partially or wholly made of a piezoelectric material. For example, one can use lead zirconium titanate (PZT) or zinc oxide (ZnO). These materials are not CMOS-compatible and, hence, cannot be easily manufactured. However, these materials may be advantageous for certain energy harvester. Alternatively, aluminium nitride (AlN) is used as the piezoelectric material of the kinetic-to-electric-energy-converter. This material can be easily manufactured using the CMOS-technology.

The vibration of the cantilever due to vibrational noise acting on the energy harvester may generate some additional energy, but as this energy is spread across a large bandwidth, only a small technical relevant amount of energy may be harvested. Therefore, it may be advantageous to operate the kinetic-to-electric-energy-converter such that it oscillates at its natural resonance frequency. When attracted and released by the first portion, the cantilever normally oscillates at its eigenfrequency. This may be beneficial compared to an external excitation.

In a disclosed embodiment, the elastic element is a cantilever or a membrane. A cantilever is easy to manufacture using already used technologies and may be easily fixed at its first end. In addition, the dimensions of the cantilever can be easily adjusted with regard to the required dimensions.

In a disclosed embodiment, the energy harvester comprises a second conductive section electrically connected between the elastic element and the second portion, wherein preferably the first end is fixed to the second conductive element. The second conductive section may provide the electrical connection between the elastic element, in particular the conductive material, and the second portion, in particular the conductive material of the second portion. The second conductive section may be made of metal. The second conductive section may also be used to fix the first end of the elastic element.

In a disclosed embodiment, the charge collecting device comprises a surface exposed to the air flow, wherein, preferably, the charge collecting device comprises a dielectric material. The surface may be plate-shaped. The provision of the plate-shaped surface may provide a large area where friction between the charge collecting device and the air flow occurs for producing triboelectricity. For example, the surface can be placed on the outer skin of an aircraft or other vehicles such as high speed trains. If the charge collecting device, and in particular the surface that is exposed to the air flow, is made of a dielectric material, the amount of generated electric energy due to triboelectricity can be improved. The dielectric material may a paint of an aircraft.

In a disclosed embodiment, the second portion includes an edge or an apex for locally increasing the electric potential of the second portion. If the electric potential of the second portion, in particular the electric potential of the conductive material of the second portion, is increased, the second portion may be more prone to release electric energy to the air flow. Hence, the energy storing unit may be discharged more readily which in turn may increase the efficiency of the energy harvester. Preferably, the conductive material of the second portion exhibits the edge or the apex.

In a disclosed embodiment, the second portion has the shape of a ridge, a cone, or a needle. The mentioned shapes of the second portion, in particular of the conductive material of the second portion, constitute preferred embodiments in order to increase the electric potential. The tip of the cone or the wire can constitute an apex. The ridge may form an edge. The second portion may be incorporated in sections of an aircraft or a vehicle which already have the shape of a ridge, a cone, or a needle and include a conductive material.

In a disclosed embodiment, the energy storing unit for storing the energy generated by the energy harvester comprises a capacitor. A capacitor is a readily available embodiment of an energy storing unit and, therefore, may be cheap and easy to implement. In addition, the energy storing unit may also include an accumulator or a combination of an accumulator and a capacitor. The capacity of the capacitor may be in the range of μF, for example 100 μF, or in the range of milliFarad to Farad.

In a disclosed embodiment, the first portion is electrically insulated from the elastic element and the second portion, in particular by an insulation layer between the first portion and the second portion. The electrical insulation between the first portion and the elastic element as well as the second portion may be provided to build up an electric field in the first portion and not to electrically short-cut the energy harvester. The electrical insulation may be provided by an insulation layer between the first portion and the second portion. The insulation layer may be a thin layer or a bulky element that is made of an electrical insulating material.

In a disclosed embodiment, the first portion is spatially separated from the elastic element and the second portion. This embodiment is for achieving an electrical insulation between the first portion and the elastic element as well as the second portion.

The invention also relates to an aircraft component comprising the energy harvester as described above wherein preferably the charge collecting device is part of an outer surface of the aircraft component. The comments and/or the advantageous effects described above with regard to the energy harvester also apply to the aircraft component. The charge collecting device of the first portion may be the outer skin of the aircraft component. The aircraft component may be the fuselage or a part of the fuselage of an aircraft. The charge collecting device may be the outer skin of the fuselage including its paint.

The invention also relates to an aircraft comprising the energy harvester as described above and/or the aircraft component as described above. The comments and/or the advantageous effects as described above with regard to the energy harvester and the aircraft component may also apply.

In summary, the embodiments an indirect approach to generate energy from triboelectricty. In a disclosed embodiment, a cantilever type structure is implemented instead of charging a capacitor directly. The first conductive section is preferably charged by the tribo-generated charges. When exceeding the pull-in voltage of the cantilever (or membrane), the cantilever may snap down and the first conductive section is discharged to the "ground", due to the bending and, hence, due to the repelling the cantilever swings back and generates electrical energy when, for example, a piezoelectric material (such as AlN) is applied (or a moving coil/magnet approach). This cycle preferably occurs again and again resulting in a "continuous" power generation. By this approach, mechanical vibration energy may be artificially generated at locations where no or too less mechanical vibration is available for technical applications. Furthermore, the transducer (e.g. cantilever) normally oscillates at its characteristic eigenfrequency thus a high energy output is ensured compared to the case when an external vibration spectrum acts on the transducer.

DESCRIPTION OF THE DRAWINGS

Exemplary embodiments of the invention are further explained in more detail with reference to the enclosed drawings, in which.

DETAILED DESCRIPTION OF EMBODIMENTS

Figure 1:
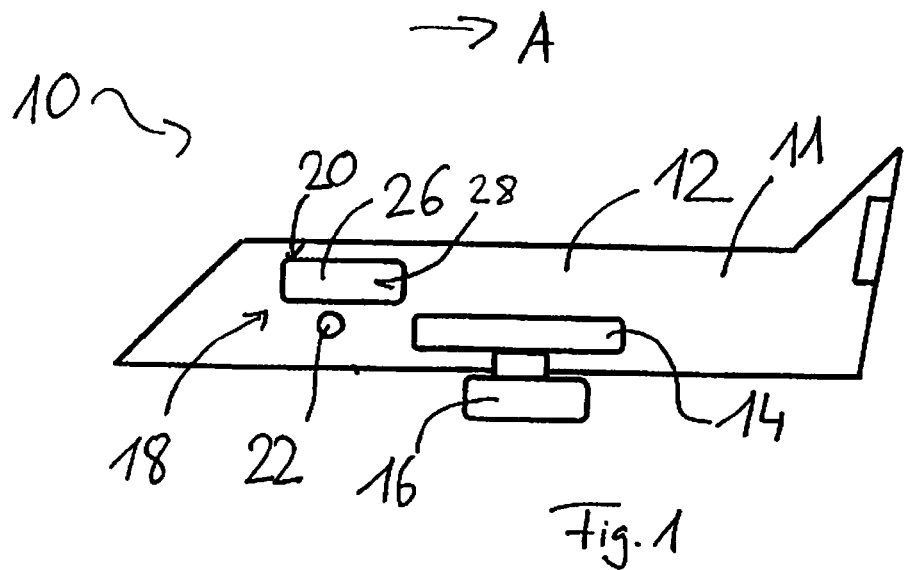
FIG. 1 illustrates an example of a side view of an aircraft.

Initially referring to FIG. 1, an aircraft 10 is built up by aircraft components 11 such as a fuselage 12 and a wing 14. A jet engine 16 is mounted to the wing 14. An energy harvester 18 is also provided with the aircraft 10.

The energy harvester 18 has a first portion 20, a movable element 21, and a kinetic-to-electric-energy-converter 23. The first portion as a charge collecting device 26 and a first conductive section 40. The charge collecting device 26 is a plate-shaped member having a surface 28 that is exposed to an air flow A flowing by the aircraft 10. The first conductive section 40 is in electrical connection with the charge collecting device 26.

The movable element 21 has a second portion 22 and an elastic element 42. The second portion 22 is in electrical connection with a second conductive section 44 that electrically connects the second portion 22 with the elastic element 42. The second portion 22 is made of metal and has the shape of a cone. The second portion 22 is arranged on the outer surface of the fuselage 12 in the vicinity of the charge collecting device 26 in order to be also exposed to the air flow A.

The second conductive section 44 is constituted by a first part 46 and a second part 48 both made of a conductive material such as metal. The first part is connected to the second portion 22. The second part 48 of the second conductive element 44 is mechanically fixed to a first end 50 of the elastic element 42.

A second end 52 of the elastic element 42 is arranged to move freely. The second end 52 can be moved towards and away the first conductive section 40 by elastically deforming the elastic element 42. The elastic element 42 is made of a conductive material such as aluminium nitride.

The kinetic-to-electric-energy-converter 23 is made of a piezoelectric material and mechanically fixed to the elastic element 42. Due to the elastic deformation of the elastic element 42, the kinetic-to-electric-energy-converter 23 is elastically deformed which generates an electrical voltage. The voltage is supplied to an electrical energy storing unit 24 in order to store the electrical energy which is generated in the kinetic-to-electric-energy-converter 23. The electrical energy stored in the energy storing unit 24 is used to power an electric device 34.

Figure 2:
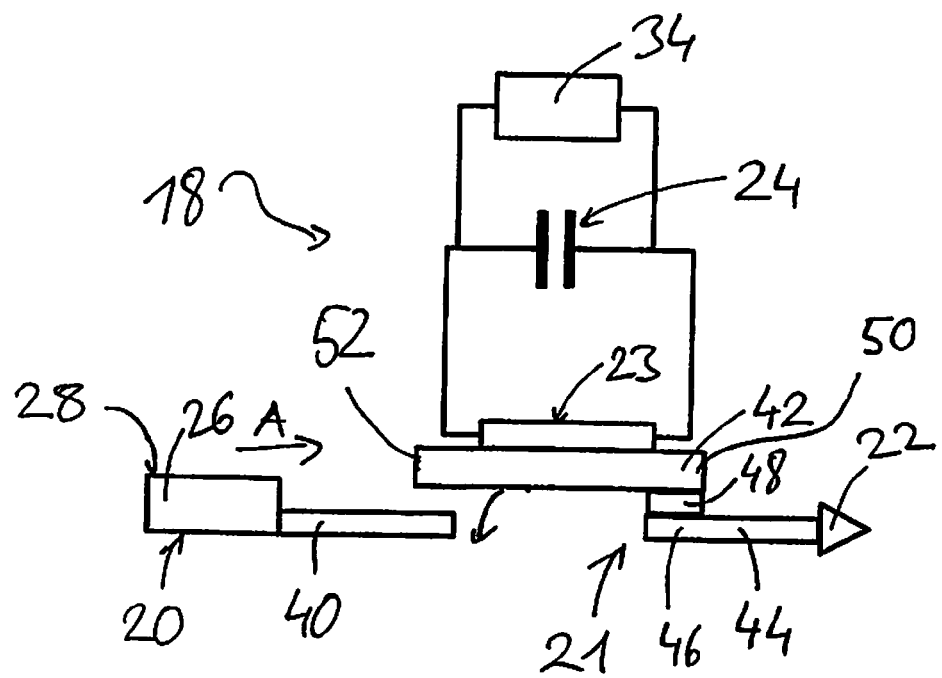
FIG. 2 illustrates a first exemplary embodiment of an energy harvester.
Figure 3:
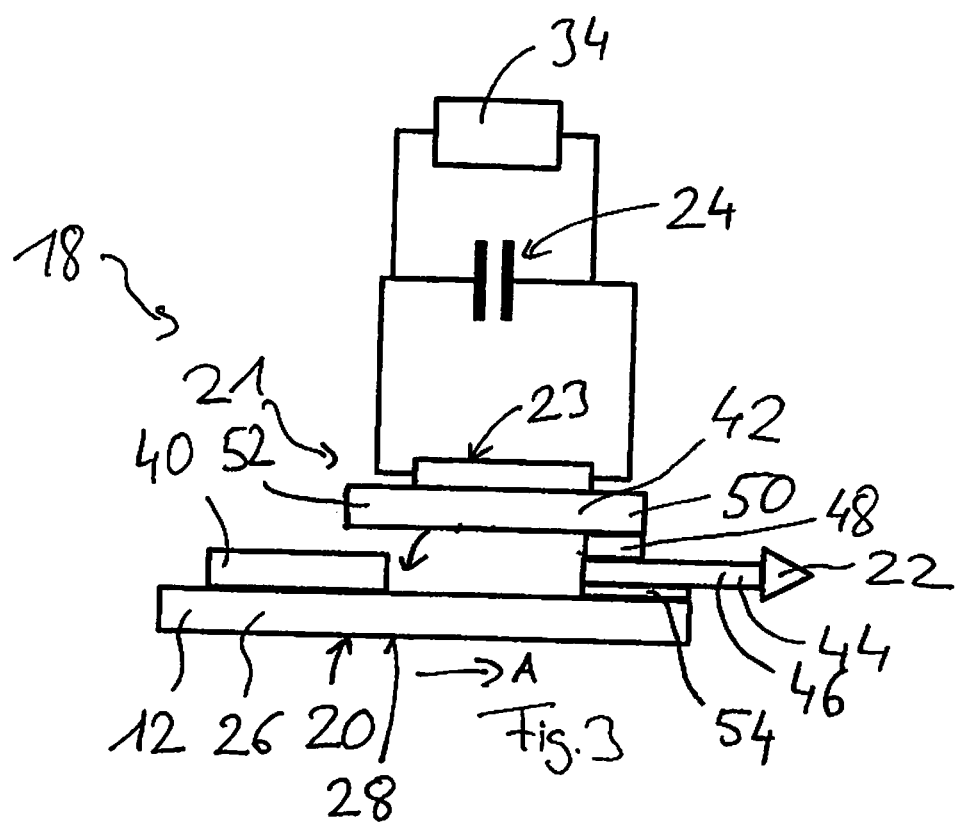
FIG. 3 illustrates a second exemplary embodiment of an energy harvester.

The first portion 20 is electrically insulated from the movable element 21 by being spatially separated in the first embodiment shown in FIG. 2. The second embodiment of the energy harvester 18, as shown in FIG. 3, differs from the embodiment as shown in FIG. 2 by the structure of the first portion 20. Other parts of the energy harvester 18 are identical; hence, the above remarks apply.

The first portion 20 is part of the fuselage 12 of the aircraft 10. In particular, the charge collecting device 26 is identical with a part of the fuselage 12 such that the surface 28 is part of the outer skin of the fuselage 12. The fuselage 12 or the charge collecting device 26 is electrically connected to the first conductive section 40 which is also arranged in the vicinity of the second end 52 of the elastic element 42. The fuselage 12 extends to the second conductive section 44. The electrical insulation between the movable element 21, in particular second conductive section 44, and the first portion 20 is achieved by an insulation layer 54 that is arranged between the second conductive section 44 and the fuselage 12.

An example of the function of the energy harvester is as follows:

The aircraft 10 moves with regard to the surrounding air. This generates an air flow A that passes along the charge collecting device 26 (the fuselage 12 in the embodiment of FIG. 3). The friction between the air flow A and the charge collecting device 26 charges the charge collecting device 26 due to triboelectricity. The generated charge is supplied to the first conductive section 40 generating an electrical field. The electrical field is interacting with the elastic element 42 being made of a conductive material. As a result, an attractive force between the first conductive section 40 and the elastic element 42 occurs bending the second end 52 of the elastic element 42 towards the first conductive section 40. The deformation of the elastic element 42 induces a deformation of the kinetic-to-electric-energy-converter 23 inducing a voltage that is supplied to the energy storing unit 24. Once the second end 52 of the elastic element 42 contacts the first conductive section 40, the charge of the first conductive section 40 can flow towards the second portion 22 where it is transmitted to the air. Consequently, the electric field of the first conductive section 40 is reduced and the elastic element 42 returns to its original position due to the internal stress. The build up of charge at the charge collecting device 26 starts over and the cycle is repeated.

What is claimed is:

1. An energy harvester for an aircraft, comprising:
a first portion including a charge collecting device having an electrical permittivity different to that of air, the charge collecting device being configured to be exposed to an air flow;
a movable element configured to be driven by a charge of the charge collecting device, the movable element comprising an elastic element having a fixed first end and a second end, the elastic element comprising a conductive material, and the second end being arranged to move freely and disposed in the vicinity of the first portion, and a second portion configured to be exposed to an air flow, the second portion comprising a conductive material and being electrically connected to the first end; and
a kinetic-to-electric-energy-converter configured to generate energy by movement of the movable element, the kinetic-to-electric-energy-converter being fixed to the elastic element.

2. The energy harvester according to claim 1, wherein the elastic element is a cantilever or a membrane.

3. The energy harvester according to claim 1, further comprising
a second conductive section electrically connected between the elastic element and the second portion, with the fixed first end being fixed to the second conductive section.

4. The energy harvester according to claim 1, wherein the charge collecting device comprises a surface exposed to the air flow and a dielectric material.

5. The energy harvester according to claim 1, wherein the second portion comprises an edge or an apex configured to locally increase an electric potential of the second portion.

6. The energy harvester according to claim 5, wherein the second portion has a shape of a cone or a needle.

7. The energy harvester according to claim 1, wherein the first portion is electrically insulated from the movable element by an insulation layer between the first portion and the second portion.

8. The energy harvester according to claim 7, wherein the first portion is spatially separated from the movable element.

9. An aircraft component comprising:
a portion having an outer surface; and
the energy harvester according to claim 1, configured such that the charge collecting device is part of the outer surface.

10. An aircraft comprising:
the aircraft component according to claim 9.

11. An aircraft comprising:
the energy harvester according to claim 1.

12. The energy harvester according to claim 1, wherein the kinetic-to-electric-energy-converter comprises a piezoelectric material, in particular a piezoelectric ceramic.

13. The energy harvester according to claim 1, wherein the first portion comprises a first conductive section electrically connected to the charge collecting device and arranged in the vicinity of the second end.

14. The energy harvester according to claim 13, wherein the elastic element is a cantilever or a membrane.

15. The energy harvester according to claim 13, further comprising
a second conductive section electrically connected between the elastic element and the second portion, with the fixed first end being fixed to the second conductive section.

16. The energy harvester according to claim 13, wherein the charge collecting device comprises a surface exposed to the air flow and a dielectric material.

17. The energy harvester according to claim 13, wherein the second portion comprises an edge or an apex configured to locally increase an electric potential of the second portion.

18. The energy harvester according to claim 13, wherein the first portion is electrically insulated from the movable element by an insulation layer between the first portion and the second portion.

19. An energy harvester for an aircraft, comprising:
a first portion including a charge collecting device having an electrical permittivity different to that of air, the charge collecting device being configured to be exposed to an air flow;
a movable element configured to be driven by a charge of the charge collecting device; and
a kinetic-to-electric-energy-converter configured to generate energy by movement of the movable element, and comprising a piezoelectric ceramic.

* * * * *